United States Patent [19]

Fraser et al.

[11] 4,362,597

[45] Dec. 7, 1982

[54] METHOD OF FABRICATING HIGH-CONDUCTIVITY SILICIDE-ON-POLYSILICON STRUCTURES FOR MOS DEVICES

[75] Inventors: David B. Fraser, Berkeley Heights; Eliezer Kinsbron, Highland Park; Frederick Vratny, Berkeley Heights, all of N.J.

[73] Assignee: Bell Telephone Laboratories, Incorporated, Murray Hill, N.J.

[21] Appl. No.: 226,104

[22] Filed: Jan. 19, 1981

[51] Int. Cl.³ .................. H01L 21/308; H01L 21/314
[52] U.S. Cl. ..................... 156/643; 29/591; 156/657; 156/659.1; 156/661.1; 357/71
[58] Field of Search ............... 156/643, 659.1, 656, 156/657, 661.1; 427/259; 29/591; 357/71

[56] References Cited

U.S. PATENT DOCUMENTS 4,004,044 1/1977 France et al. .................. 427/43
4,244,799 1/1981 Fraser et al. .................. 204/192

OTHER PUBLICATIONS

Morau, J. M. and Maydau, D., *High Resolution, Steep Profile, Resist Patterns*, The Bell System Technical Journal, 58(5): pp. 1027–1036, May–Jun., 1979.
Murarka, S. P., et al., *Refractory Silicides of Titanium and Tautalum for Low-Resistivity Gates and Interconnects*, IEEE (Journal of Solid-State Circuits, SC–15(4): pp. 474–482, Aug. 1980.

*Primary Examiner*—Evan K. Lawrence
*Attorney, Agent, or Firm*—Lucian C. Canepa

[57] ABSTRACT

It is known to deposit a refractory metal silicide on a polysilicon gate layer to form a low-resistivity composite structure. For VLSI MOS devices, very-high-resolution patterning of the composite structure is required. In accordance with this invention, a silicide pattern is formed on polysilicon by a lift-off technique. In turn, the patterned silicide is utilized as a mask for anisotropic etching of the underlying polysilicon. High-conductivity composite silicide-on-polysilicon gate structures for VLSI MOS devices are thereby achieved.

7 Claims, 7 Drawing Figures

METHOD OF FABRICATING HIGH-CONDUCTIVITY SILICIDE-ON-POLYSILICON STRUCTURES FOR MOS DEVICES

BACKGROUND OF THE INVENTION

This invention relates to the fabrication of integrated circuits and, more particularly, to a technique for high-resolution patterning of silicide-on-polysilicon structures for metal-oxide-semiconductor (MOS) devices.

It is known to utilize a refractory metal silicide on polysilicon to achieve a high-conductivity gate-level metallization for MOS devices. Specific examples of such silicide-on-polysilicon composite structures suitable for MOS devices are described in a copending commonly assigned application of H. J. Levinstein, S. P. Murarka and A. K. Sinha, Ser. No. 974,378, filed Dec. 29, 1978, now U.S. Pat. No. 4,276,557 issued June 30, 1981. Additional details concerning the use of silicide-on-polysilicon composites in such devices are contained in an article by S. P. Murarka, D. B. Fraser, A. K. Sinha and H. J. Levinstein entitled, "Refractory Silicides of Titanium and Tantalum for Low-Resistivity Gates and Interconnects," *IEEE Journal of Solid-State Circuits,* Vol. SC-15, No. 4, August 1980, pp. 474–482.

The effective utilization of silicide-on-polysilicon composites in very-large scale-integrated (VLSI) MOS devices to form, for example, high-resolution gate electrodes requires that fabrication techniques be available for patterning silicide and polysilicon layers anisotropically with minimal linewidth loss. Accordingly, efforts have been directed at trying to devise high-resolution etching processes for patterning such layers. For some silicides, these efforts to devise an effective etching process adequate for defining high-resolution features in VLSI devices have not been completely successful. Moreover, the efforts to incorporate and pattern silicides in such devices have been complicated by the apparent necessity of having to develop a different etching procedure for each different silicide-on-polysilicon combination.

SUMMARY OF THE INVENTION

Hence, an object of the present invention is an improved procedure for making VLSI devices. More specifically, an object of this invention is a general purpose method for high-resolution patterning of silicide-on-polysilicon composite structures for VLSI MOS devices.

Briefly, these and other objects of the present invention are realized in a specific illustrative embodiment thereof in which a high-resolution masking pattern is formed in a sacrificial layer that overlies a polysilicon layer. The pattern covers all but selected surface regions of the polysilicon layer. The selected surface regions are then isotropically etched. Next, a layer of co-deposited metal and silicon is formed on top of the sacrificial layer and on the selected surface regions of the polysilicon layer. Subsequently, the masking pattern is removed thereby lifting off those portions of the co-deposited layer residing on top of the masking pattern and leaving in place those portions of the co-deposited layer formed on the selected surface regions of the polysilicon layer. These remaining portions are then sintered to form a high-conductivity silicide. Finally, utilizing the sintered portions as a mask, the polysilicon layer is anisotropically dry etched to define high-resolution silicide-on-polysilicon structures.

In an alternative embodiment, the polysilicon layer is initially entirely covered with a relatively thin intermediate layer. In that case, the high-resolution masking pattern formed in the overlying sacrificial layer covers all but selected surface regions of the intermediate layer. The selected surface regions of the intermediate layer are then isotropically etched to expose polysilicon thereunder. Subsequent steps of this alternative procedure are the same as those set forth in the paragraph immediately above except that prior to the aforespecified removal of polysilicon by dry etching, the remaining portions of the intermediate layer are removed in a separate etching step.

BRIEF DESCRIPTION OF THE DRAWING

A complete understanding of the present invention and of the above and other features thereof may be gained from a consideration of the following detailed description presented herein-below in connection with the accompanying drawing, in which.

DETAILED DESCRIPTION

In accordance with the principles of the present invention, a high-resolution silicide-on-polysilicon structure is formed in a VLSI device in a fabrication sequence that includes a so-called lift-off step. To implement the lift-off step, it is particularly advantageous to form a pattern in the device to be fabricated by employing the process described by J. M. Moran and D. Maydan in "High Resolution, Steep Profile, Resist Patterns", in *The Bell System Technical Journal,* volume 58, No. 5, May-June 1979, pp. 1027–1036. This process is also described in a commonly assigned copending U.S. application of D. B. Fraser, D. Maydan and J. M. Moran designated Ser. No. 941,369, filed Sept. 11, 1978, now U.S. Pat. No. 4,244,799, issued Jan. 13, 1981. The described process, which is sometimes referred to as the trilevel process, is characterized by submicron resolution with excellent linewidth control and step coverage.

Figure 1:
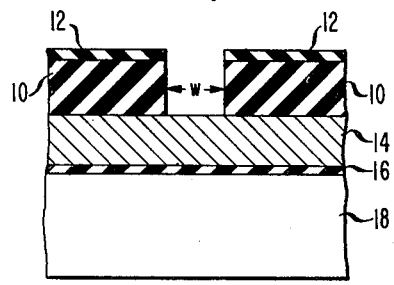
FIGS. 1 through 5 respectively depict an MOS device during manufacture at successive steps of a specific illustrative fabrication sequence that embodies the principles of the present invention.

FIG. 1 depicts a high-resolution steep-profile pattern made in accordance with the aforespecified trilevel processing sequence. The depicted pattern is shown formed in a relatively thick layer 10 of a hardened organic material. By way of example, the patterned layer 10 is approximately 1.5 micrometers ($\mu$m) thick. Typical materials therefor will be specified below. Deposited on top of the layer 10 is a so-called intermediate masking layer 12 approximately 0.12 $\mu$m thick and made, for example, of plasma-deposited silicon dioxide. In prior steps of the standard trilevel process, the layer 12 was selectively etched using a thin overlying high-resolution resist pattern (not shown) as the mask therefor. The pattern in the relatively thin layer 12 was then transferred into the underlying layer 10 to form a corresponding pattern, by conventional techniques known in the art.

Illustrative organic materials from which to form the layer 12 shown in FIG. 1 include a polyimide designated PIQ made by Hitachi Ltd., Tokyo, Japan, a polyimide designated Pyralin made by E. I. duPont de Nemours and Co., Wilmington, Del. and a class of novalac-type resists designated HPR made by Philip A. Hunt Chemical Corp., Palisades Park, N.J. Other suitable materials available for making the pattern 12 include standard products such as KPR, KMER, AZ1350 and Polychrome resists.

In FIG. 1, the patterned layer 10 is formed on a polycrystalline silicon layer 14. Illustratively, the layer 14 comprises a 350-nanometer (nm)-thick layer of conventional phosphorus-doped polysilicon. In turn, the polysilicon layer 14 overlies a standard gate oxide layer 16 which, for example, is about 25-to-70 nm thick. The layer 16 is formed on a conventional VLSI substrate which comprises typically a silicon wafer 18.

In accordance with the principles of the present invention, a silicide layer is to be deposited on top of the polysilicon layer 14 of FIG. 1 in the windows or openings formed in the patterned layer 10. Thereafter, the polysilicon underlying the silicide is to be patterned to form a composite silicide-on-polysilicon gate electrode structure whose width corresponds substantially exactly to the width w (FIG. 1) of the window formed in the organic layer 10. In practice, the patterned composite structure also comprises associated gate-level interconnects. By means of such interconnects, the gate electrode is electrically connected to other portions of the device being fabricated.

For VLSI MOS devices, the width w (FIG. 1) definitive of the aforespecified gate electrode is, for example, sometimes specified to be one $\mu$m or less. It is apparent, therefore, that patterning the gate electrode portion of the conductive gate-level pattern constitutes a particularly difficult step in the overall fabrication sequence. In accordance with the principles of the present invention, a silicide-on-polysilicon composite layer is successfully patterned in a high-resolution way compatible with the requirements of VLSI MOS devices.

Various silicides known in the art are suitable for utilization in applicants' herein-specified device fabrication sequence. These include the silicides of tantalum, titanium, molybdenum, tungsten, nickel and cobalt. Further, it is known that such silicides can be formed in a variety of standard ways. By way of example, silicides can be formed by sintering of the metal, or of the metal-silicon alloy deposited by (a) sputtering or evaporation, (b) co-sputtering metal and silicon from two independent targets, (c) sputtering from a hot-pressed silicide target, or (d) co-evaporating from the elements.

Herein, the term metal-containing layer will be employed to encompass both a metallic layer that will react with the underlying polysilicon to form a silicide upon sintering and a deposited layer of metal and silicon that forms a silicide layer upon sintering without reacting with the underlying polysilicon.

Herein, for purposes of a specific illustrative example, it will be assumed that the layer to be patterned is a co-sputter-deposited layer of tantalum and silicon. The silicide formed therefrom, $TaSi_2$, has been demonstrated to be compatible with MOS fabrication processes and has been utilized to make actual working MOS devices.

Figure 2:
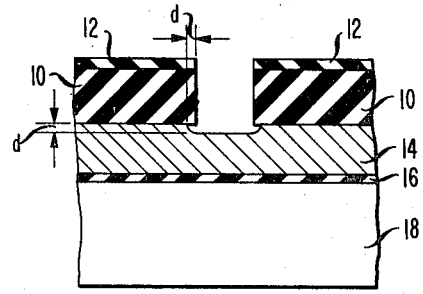

In accordance with one feature of the principles of the present invention, a preparatory step is carried out before depositing tantalum and silicon on the aforedescribed structure shown in FIG. 1. This preparatory step, whose purpose will be evident later below, comprises isotropically etching the uncovered or exposed portions of the polysilicon layer 14 of FIG. 1. Illustratively, such etching is done in a standard dry etching step that utilizes a plasma, composed, for example, of $CF_4$ and $O_2$, known for its ability to isotropically etch polysilicon. In that way, the uncovered portions of the polysilicon layer 14 are isotropically etched, as represented in FIG. 2. In one specific example, the polysilicon was thereby etched both vertically and laterally (under the depicted vertical edges of the patterned layer 10) a distance d. In one particular device structure, d approximated 100 nm.

Next, in accordance with applicants' fabrication sequence, a layer of tantalum and silicon is co-sputter-deposited in a standard manner onto the surface of the FIG. 2 structure. Portions 20a and 20b of the deposited layer are formed on top of the layer 12. A portion 20c, which constitutes a part of the final desired silicide-on-polysilicon composite gate structure, is formed on top of the polysilicon layer 14. Illustratively, the portions 20a, 20b and 20c are each nominally approximately 300 nm thick. (In practice, the portion 20c is typically slightly thinner than the portions 20a and 20b due to the shadowing effect of the masking layer 10.) Additionally, during the co-sputtering step some tantalum and silicon are usually unavoidably deposited on the vertical sidewalls of the masking layer 10. These last-mentioned deposits are designated 20d and 20e in FIG. 3.

Figure 3:
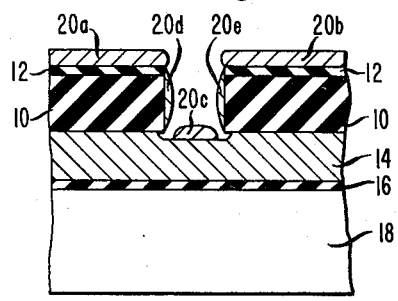

In practice, because of the aforespecified isotropic etching of the polysilicon layer 14, gaps or discontinuities purposely occur between the deposited portion 20c and the sidewall portions 20d and 20e of FIG. 3. As a result, channels exist between the portion 20c and the portions 20d, 20e through which a solvent can be introduced for breaking the bonds between the layers 10 and 14 to achieve lift-off.

Figure 4:
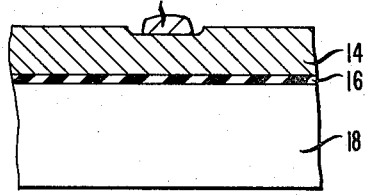

A particularly advantageous formulation for achieving lift-off in the FIG. 3 structure is described in a copending commonly assigned U.S. application of E. Kinsbron and F. Vratny designated Ser. No. 214,171, filed Dec. 8, 1980. The formulation for removing the patterned layer 10 (and thereby also the portions 20a, 20b, 20d and 20e) comprises anhydrous hydrazine or, preferably, a mixture of anhydrous hydrazine and dimethyl sulfoxide. Both of these constituents are readily available commercial products. Advantageously, the mixture comprises by volume 80-to-95 percent anhydrous hydrazine and 5-to-20 percent dimethyl sulfoxide. This mixture is designed to be applied by any standard technique to the surface of the FIG. 3 structure. When so applied, the mixture penetrates the interfaces between the masking layer 10 and the underlying polysilicon layer 14. Moreover, the penetrating mixture is effective to break the adhesive bonds between these layers at the interfaces therebetween. In practice, the interface between the deposited portion 20c and the polysilicon layer 14 is substantially unaffected. As a result, the patterned layer 10 carrying thereon the layer 12 and the portions 20a, 20b, 20d and 20e is lifted off the polysilicon layer 14. But the portion 20c, which constitutes a component of the final desired silicide-on-polysilicon metallization pattern, remains on the layer 14, as depicted in FIG. 4.

In an actual device structure of the type shown in FIG. 3, the patterned layer 10 was removed by the aforespecified formulation in a matter of several seconds to several minutes. Application of the formulation at room temperature (20 degrees C.) is feasible. By raising the temperature to say 50 degrees C., the time required for removal is shortened.

Significantly, the aforespecified formulation utilized in the lift-off step is highly selective in its action. As described above, it is effective to quickly break the adhesive bonds between the pattern 10 and the underlying layer 14. At the same time, the formulation does not affect to any substantial extent the bond between the portion 20c and the layer 14. Moreover, the formulation does not to any substantial extent etch or otherwise deleteriously affect the layer 14.

As noted in the above-cited Kinsbron-Vratny application, the aforespecified formulation utilized in the lift-off step is toxic and potentially flammable. Hence, appropriate standard handling and processing precautions must be followed to avoid ignition thereof.

It is advantageous to carry out the aforespecified lift-off step in a confined enclosure, for example in a closed glass container. Personnel are thereby protected from any vapors that may emanate from the device structure during processing while, at the same time, the step can thereby be visually monitored. Further, the possibility of contaminating the process by introducing water is thereby minimized.

After lift-off, the structure shown in FIG. 4 is conventionally cleaned, rinsed and dried in a series of standard steps known in the art. Subsequently, the deposited portion 20c is sintered. Illustratively, sintering is done by placing the FIG. 4 structure in a hydrogen atmosphere at 900 degrees C. for approximately 30 minutes. (Alternatively, sintering can be carried out in an inert gas atmosphere or in a standard high-vacuum furnace at approximately 900 degrees C. for about 30 minutes.) A high-conductivity silicide-on-polysilicon composite, comprising the portion 20c and the polysilicon directly thereunder, is thereby formed. And, since sintering occurs while the gate oxide layer 16 and the substrate 18 are covered with the polysilicon layer 14, the breakdown characteristic of the layer 16 is not deleteriously affected during sintering and, moreover, harmful contaminants are not thereby introduced into those regions of the substrate 18 which later are to serve as source and drain regions.

Figure 5:
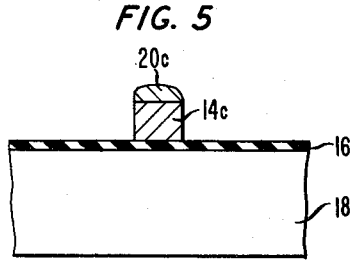

After the aforedescribed sintering step, the polysilicon layer 14 shown in FIG. 4 is anisotropically etched to define the above-specified silicide-on-polysilicon gate electrode. The resulting structure is depicted in FIG. 5 wherein the remaining portion of the layer 14 is designated 14c. In accordance with a feature of the principles of the present invention, etching of the polysilicon layer 14 is carried out utilizing the sintered portion 20c as an etch-resistant mask. Advantageously, etching of the layer 14 is done in a plasma-assisted dry etching step in a process typically referred to as reactive sputter etching or reactive ion etching. It is known that in such a process doped polysilicon can be anisotropically etched. (See, for example, a copending commonly assigned application of D. Maydan and D. N. Wang, Ser. No. 119,103, filed Feb. 6, 1980, now abandoned and replaced by a continuation application, Ser. No. 300,307, filed Sept. 8, 1981, for a detailed description of such an anisotropic etching process for doped polysilicon utilizing chlorine as the active reactant species.)

Further processing of the structure shown in FIG. 5 to achieve an MOS device is carried out in a conventional way in a series of standard additional steps. These additional steps typically include, for example, removing those portions of the gate oxide layer 16 that do not lie directly under the masking portions 14c and 20c. Thereafter, spaced-apart source and drain regions alongside the aforespecified composite silicide-on-polysilicon gate electrode are formed in the substrate 18, in a manner well known in the art. (Alternatively, the relatively thin gate oxide layer 16 may be left intact and the source and drain regions formed in the substrate 18 by ion implanting impurities through the layer 16.)

In the process described above and illustrated in FIGS. 1 through 5, the thickness of the remaining polysilicon portion 14c (FIG. 5) is typically approximately 100 nm less than the thickness of the originally formed layer 14 (FIG. 1). This thinning, which stems from the aforedescribed isotropic etching of the layer 14 (see FIG. 2) can be substantially exactly controlled and is reproducible in a device fabrication sequence. Accordingly, in practice the layer 14 is simply initially formed sufficiently thicker than the final desired thickness of the portion 14c to allow for the noted thinning.

Figure 6:
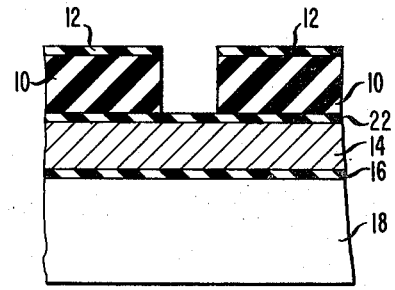
FIGS. 6 and 7 respectively represent an MOS device at successive steps of an alternative sequence that embodies the principles of this invention.

Alternatively, in accordance with another embodiment of the principles of the present invention, the initially formed thickness of the polysilicon layer 14 can remain intact during processing. This is accomplished by covering the layer 14 with a thin intermediate layer 22, as shown in FIG. 6. After isotropically etching the layer 22, as specified below, the profile of this alternative device structure (see FIG. 7) is substantially similar to that shown in FIG. 2. The other parts of the structures shown in FIGS. 6 and 7 are identical to the corresponding parts of FIG. 1 and are, accordingly, designated by the same reference numerals.

The layer 22 of FIG. 6 comprises, for example, a 100-nm-thick layer of conventional plasma-deposited $SiO_2$. In accordance with the principles of the present invention, the layer 22 is isotropically etched to expose or uncover the surface of the polysilicon layer 14, as indicated in FIG. 7. In FIG. 7, the extent e of the undercut approximates 100 nm. As is well known, such isotropic etching of $SiO_2$ can be carried out, for example, in a standard wet etching step utilizing buffered hydrofluoric acid.

Figure 7:
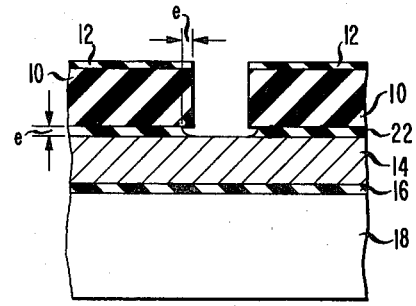

Subsequent steps in the fabrication sequence required to complete the device shown in FIG. 7 correspond to those described earlier above and represented by FIGS. 3 through 5. These steps include deposition of portions corresponding to the portions 20a through 20e of FIG. 3 and subsequent lift-off of the layer 10. Because of the purposely formed undercuts shown in FIG. 7, lift-off is facilitated, for the reasons described in detail earlier above. After lift-off, the remaining portions of the $SiO_2$ layer 22 are removed in another wet etching step utilizing buffered HF. Thereafter, sintering and the additional steps of this alternative procedure are identical to those described above in connection with FIGS. 4 and 5. The final gate structure achieved by the alternative procedure resembles that shown in FIG. 5. The difference between the two structures is that in FIG. 5 the thickness of the underlying polysilicon portion 14c is less than the thickness of the initially formed polysilicon layer 14, whereas in the device derived from FIG. 7 the thickness of the underlying polysilicon portion and of the initially formed polysilicon layer are the same.

Finally, it is to be understood that the above-described techniques are only illustrative of the principles of the present invention. In accordance with these principles, numerous modifications and alternatives may be devised by those skilled in the art without departing from the spirit and scope of the invention.

What is claimed is:

1. A method of fabricating high-conductivity silicide-on-polysilicon structures in an MOS device, said method comprising the steps of forming a high-resolution pattern overlying a polysilicon layer of said device to define selected regions of said layer, depositing a metal-containing layer on top of said pattern and on said selected regions, the metallic constituent in said layer being selected from the group consisting of titanium, tantalum, molybdenum, tungsten, nickel and cobalt, which metal-containing layer is of the type that, upon sintering, will form a silicide, lifting off said pattern thereby leaving on said device only the metal-containing layer deposited on said selected regions, sintering said remaining metal-containing deposits to form composite silicide-on-polysilicon structures in said selected regions, and, utilizing said sintered metal-containing deposits as an etch-resistant mask, anisotropically etching said polysilicon layer to remove all portions thereof except said silicide-on-polysilicon structures.

2. a method as in claim 1 wherein, prior to said depositing step, the surfaces of the selected regions of said polysilicon layer are isotropically etched to thin the polysilicon layer to its final desired thickness.

3. A method as in claim 1 wherein an intermediate layer is formed on top of said polysilicon layer, and wherein, prior to said depositing step, said intermediate layer is patterned in an isotropic etching step to expose surface regions of said polysilicon layer.

4. A method of fabricating a high-conductivity gate structure in an MOS device that comprises a silicon substrate having a gate oxide layer formed on said substrate and a doped polysilicon layer overlying said gate oxide layer, said method comprising the steps of forming a high-resolution masking pattern with substantially vertical sidewalls on said polysilicon layer to cover all but selected surface regions of said polysilicon layer, isotropically etching said selected surface regions to thin the polysilicon layer to its final desired thickness, depositing a metal-containing layer on top of said masking pattern and on said selected surface regions, the metallic constituent in said layer being selected from the group consisting of titanium, tantalum, molybdenum, tungsten, nickel and cobalt, which metal-containing layer is of the type that, upon sintering, will form a silicide, removing said masking pattern from said polysilicon layer thereby lifting off those portions of said metal-containing layer deposited on top of said masking pattern and leaving in place on said selected surface regions those portions of said metal-containing layer deposited on said regions, sintering the remaining portions of said metal-containing layer to form composite silicide-on-polysilicon structures in said selected regions, and, utilizing said remaining sintered portions as a mask, anisotropically etching said polysilicon layer to define a high-conductivity silicide-on-polysilicon gate structure in said device.

5. A method of fabricating a high-conductivity gate structure in an MOS device that comprises a silicon substrate having a gate oxide layer formed on said substrate, a doped polysilicon layer overlying said gate oxide layer and an intermediate layer overlying said polysilicon layer, said method comprising the steps of forming a high-resolution masking pattern with substantially vertical sidewalls on said intermediate layer to cover all but selected surface regions of said intermediate layer, isotropically etching said intermediate layer to expose surface regions of said polysilicon layer, said masking pattern and on said surface regions of said polysilicon layer, the metallic constituent in said layer being selected from the group consisting of titanium, tantalum, molybdenum, tungsten, nickel and cobalt, which metal-containing layer is of the type that, upon sintering, will form a silicide, removing said masking pattern from said intermediate layer thereby lifting off those portions of said metal-containing layer deposited on top of said masking pattern and leaving in place on said surface regions of said polysilicon layer those portions of said metal-containing layer deposited on said regions, removing the remaining portions of said intermediate layer, sintering the remaining portions of said metal-containing layer to form composite silicide-on-polysilicon structures in said selected regions, and, utilizing said remaining sintered portions as a mask, anisotropically etching said polysilicon layer to define a high-conductivity silicide-on-polysilicon gate structure in said device.

6. A method of patterning a doped polysilicon layer, comprising the steps of forming on the surface of said polysilicon layer a pattern made of a silicide, and, utilizing said silicide pattern as an etch-resistant mask, anisotropically etching said polysilicon layer.

7. A method as in claim 6 wherein said silicide comprises, $TaSi_2$, and wherein said etching step constitutes a reactive ion etching step utilizing chlorine as the active reactant species.

* * * * *